United States Patent [19]

Boenning et al.

[11] 4,004,843
[45] Jan. 25, 1977

[54] PROBE PIN

[75] Inventors: Robert A. Boenning, Timonium; George R. Welden, Cockeysville, both of Md.

[73] Assignee: Westinghouse Electric Corporation, Pittsburgh, Pa.

[22] Filed: Sept. 25, 1975

[21] Appl. No.: 616,710

[52] U.S. Cl. .................... 339/108 TP; 324/72.5; 339/275 B; 339/278 T
[51] Int. Cl.² ........................................ H01R 13/00
[58] Field of Search ................. 324/72.5, 149, 158; 339/108 TP, 108 R, 111, 278 T, 275 B

[56] References Cited

UNITED STATES PATENTS

| | | | |
|---|---|---|---|
| 3,068,403 | 12/1962 | Robinson | 324/72.5 X |
| 3,753,103 | 8/1973 | Tetreault et al. | 324/72.5 |

*Primary Examiner*—Roy Lake
*Assistant Examiner*—DeWalden W. Jones
*Attorney, Agent, or Firm*—H. W. Patterson

[57] ABSTRACT

A spring loaded probe pin for making electrical contact with a printed circuit board in particular, a solder pad, is disclosed. The pin has a contact face of deformable synthetic thermoplastic resin to provide an electrically conductive low resistance area contact.

8 Claims, 8 Drawing Figures

U.S. Patent  Jan. 25, 1977  4,004,843
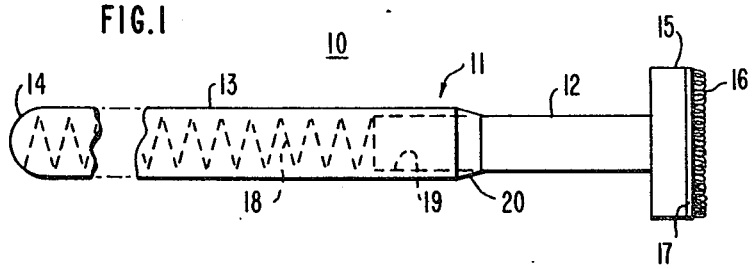
FIG.1
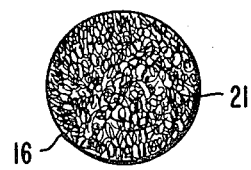
FIG.2
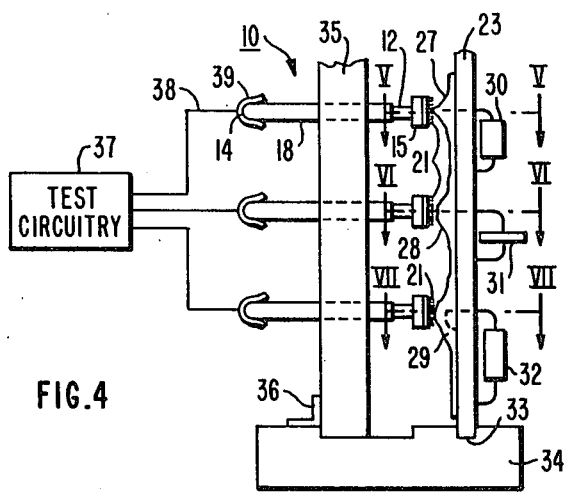
FIG.4
FIG.3
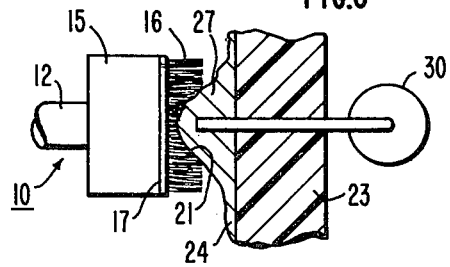
FIG.5
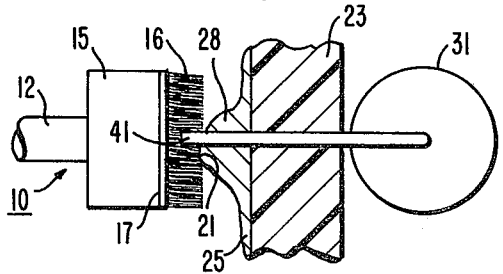
FIG.6
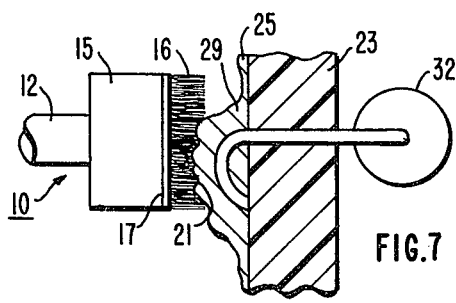
FIG.7
FIG.8

PROBE PIN

BACKGROUND OF THE INVENTION

The present invention relates to probe pins used in automatic testing apparatus for printed circuit boards. Each of a plurality of probe pins is mounted in alignment with a selected solder pad or other circuit node of the printed circuit board to be tested. The mounted pins, which are connected at one end to a test circuit, are positioned so that the contact face at the end of the pins are in slight pressure engagement with their respective aligned solder pads or nodes to provide the required electrical contact.

A typical printed circuit board is made up of a sheet of insulating material, such as epoxy-glass laminate, for example, with a plurality of miniature electronic components, such as resistors, capacitors, transistors, etc. mounted on one or both sides of the board. The wire connections for each of the components extend through holes to the opposite side of the board and are connected to each other in the required manner by metallic strips etched on the opposite surface of the insulating board. At the point where the connecting wires for the components extend through the boards, small, thicker and irregular solder pads are formed as part of the metallic strips. In some instances, the tip of the wire extends through the surface of the solder pad; in other instances, the tip of the wire may be bent such that the solder pad completely covers it. To protect the etched surface, the board is usually sprayed with a thin coating of insulating material which is referred to as a conformal coating.

The various components of printed circuit boards were tested in the past, with hand held probes connected at one end to a voltmeter or other instrument. These probes were manipulated manually until the outer end or contact face made the required electrical contact with the desired solder pad. Presently, particularly in the automatic testing of printed circuit boards, a number of probe pins are mounted in a test board; and positioned so that when the test board is placed in close proximity to the opposite or back side of the printed circuit board, the tip or contact face of each probe pin engages the required solder pad to provide the necessary electrical contact. The test circuit is connected electrically to the other end of each probe pin or to a socket in the test board into which each of the pins are mounted. The test circuit may be connected to a computer to provide a diagnostic printout of the entire printed circuit. In such automatic testing apparatus, it is common practice to provide a probe pin which is spring loaded to yield axially at one or two ounces of force, for example, in order to make a proper electrical contact between the contact face of the probe pin and the solder pad. Thus, any slight parallel misalignment between the printed circuit board and the test board into which the probe pins are mounted, or variation in thickness and shape of the individual solder pads does not effect the accuracy of the test.

However, because of the irregular configuration of the solder pads, there are times when the contact face of the probe pin makes a point contact with the solder pad which creates a high resistance, resulting in a faulty test readout. Various attempts have been made to assure an adequate low resistance contact between the contact face of the probe pin and the solder pad by configuring the metallic contact face of the probe pin into a cup, or a small disc or cylinder with a serrated edge, for example, Although these different configurations of the probe pin contact face provided an increase in reliability of the automatic testing equipment, the irregularities and the different configurations of the solder pads still presented problems of high resistance contact. The problem is still more acute with printed circuit boards that have been in service; because, they have been coated with a conformal coating. Of course, an attempt is made to remove the conformal insulative coating from the solder pads by light abrading, so as not to remove any of the etched circuit. However, in some instances, the irregular solder pad surface prevents the complete removal of the coating; and regardless of the configuration of the contact face of the probe pin, an error would occur in the diagnostic readout, either due to a high resistance point contact or failure of the contact face of the probe pin to make contact at all.

One type of probe pin in use, which overcomes the problems of high resistance or improper contact, utilizes a contact face made of a small cylinder of fine woven wire. The woven wire cylinder varies from 1/16 to 1/8 of an inch in diameter, and from 3/100 to 1/10 of an inch in thickness. The diameter of the individual woven wire strands is approximately 3/1000 of an inch. This woven wire contact face of the probe pin appears to the naked eye not unlike a miniaturized metallic scouring pad. Probe pins having the woven metallic wire contact face provide a low resistance area contact and appear to be reliable for the various solder pad configurations and irregularities. However, the woven wire contact probe pins are expensive to fabricate because of the overall small diameter of the contact face and the small diameter of the wire. Further, after repeated deformation during use, wire tends to lose it s resilient aspects, which limits the useful life of the contact face of the probe pin.

The purpose of the present invention is to provide an improved probe pin which is inexpensive to fabricate, has a long life and still retains the advantage of providing at its contact face a low resistance area contact when in slight pressure engagement with printed circuit board solder pads. Such a probe pin should have the aforesaid features to be reliable during automatic testing regardless of the irregularities and different configurations of the solder pads and regardless of traces of the insulated conformal coating which may exist on portions of the solder pads.

SUMMARY OF THE INVENTION

A probe pin having an electrically conductive shank and a deformable contact face made of an electrically conductive resilient piece of resin affixed to one end of the shank. The face of the resin is deformable to physically engage the irregularities of the solder pad. The resilient piece is affixed at its other side to the end of the conductive shank. The resilient piece may be a synthetic thermoplastic resin, such as nylon, linear polyesters, etc., which may be cut or stamped from a resilient sheet, or in the form of a fabric having a deformable pile contact face.

A plurality of such probe pins are intended to be mounted in a board of a test jig to align with specific solder pads of the printed circuit board to be tested. When the test board jig is positioned parallel and in close proximity to the back of a printed circuit board, each of the probe pin contact faces engage under slight pressure their respective aligned solder pads and deform slightly to provide the required low resistance area contact.

BRIEF DESCRIPTION OF THE DRAWINGS

FIG. 1 is an enlarged axial view of a probe pin in accordance with one embodiment of the invention;

FIG. 2 is a front end radial view of the contact face of the probe pin of FIG. 1;

FIG. 3 is a fragmentary plan view of the backside of a printed circuit board illustrating a typical arrangement of etched circuits and the solder pads with which the probe pin of the present invention is adapted to be used;

FIG. 4 is a fragmentary elevation of a printed circuit board testing apparatus illustrating the manner in which a plurality of the probe pins of FIG. 1 electrically contact the solder pads of FIG. 3;

FIG. 5 is an enlarged fragmented side elevation taken at line 5—5 of FIG. 4 and looking in the direction of the arrows, to show the typical deformation and wide area contact of the probe pin of the present invention in operative engagement with a solder pad of one configuration during operative engagement;

FIG. 6 is an enlarged fragmented side elevation taken at line 6—6 of FIG. 4 and looking in the direction of the arrows to show the typical deformation of the contact face of the probe pin of the present invention in operative engagement with a solder pad of another configuration;

FIG. 7 is an enlarged fragmented cross section taken on line 7—7 of FIG. 4 to show the typical deformation of the contact face of the probe pin of the present invention in operative engagement with a solder pad of still another configuration; and FIG. 8 is a view similar to FIG. 7, except that it shows an alternate embodiment wherein the contact face of the probe pin is made of a piece of resilient synthetic polyester resin.

DESCRIPTION OF THE PREFERRED EMBODIMENT

Referring to the embodiment of FIG. 1, a probe pin 10 includes a shank 11 that consists of a rod 12 telescopically fit into a tube 13 having a closed end 14. Attached to the outer end of the rod 12 is a cylindrical contact head 15. A piece of conductive cloth or fabric 16 is cemented to the radial face of the contact head 15 by a layer of conductive epoxy 17 to provide the contact face of the probe 10. A coil spring 18 inside the tube 13 compresses against the inner radial face of the rod 12 so that the rod 12 may be compressed inwardly into the tube 13 at a force of one to two ounces for example. An enlarged diameter portion 19 of the rod 12 abuts against a crimped shoulder 20 of the tube 13 to maintain the shank 11 in an assembled condition.

Referring to FIG. 2, the contact face 16, is made of a snythetic resin that is highly filled with a metallic powder, such as silver, copper, etc., to render it electrically conductive. In the embodiment of FIG. 2, the contact face 16 is cut or stamped from such electrically conductive fabric or cloth; and is in the form of a disc of substantially the same diameter as the contact head 15 portion of the shank 11. The cloth 16 is made of fine metallic filled electrically conductive resin fibers having a rug type woven backing with a short loop pile extending from one side. The looped pile side of the fabric 16 forms a deformable contact face 21 when the probe pin 10 is in slight pressure engagement with a solder pad. In one actual reduction to practice, the disc 16 was stamped from a piece of electrically conductive nylon fabric having an approximate overall thickness, including the pile, of approximately 1/32 of an inch, with approximately 10 to 15 thousand individual looped fibers to the square inch. The conductive fibers were of approximately ½ of a mil in diameter.

FIG. 3 illustrates, in approximate actual size, a back surface 22 of a portion of a printed circuit board 23, which may be tested by a testing apparatus utilizing the probe pins 10 of the present invention. Circuit paths such as 24, 25 and 26, for example are etched in a conventional manner; and extend to form solder pads such as 27, 28, and 29. These solder pads are made slightly thicker than the etched circuit paths connecting them to other solder pads, as shown in FIG. 4, in order to adequately secure the wire connections of the electronic components mounted on the opposite side of the printed circuit board 23. Also, and with reference to FIG. 4 the solder pad sections 27, 28 and 29 not only have surface irregularities, but they may be also different in overall contour making it difficult, particularly with traces of conformal coating thereon, for a metallic contact face to provide an adequate low resistance contact for testing. A typical test arrangement such as shown in FIG. 4 includes the printed circuit board such as 23, having typical miniature electronic components 30, 31 and 32 with their individual wire connections embedded in the solder pad 27, 28, and 29 respectively. A typical test apparatus provides for mounting upright the printed circuit board 23 in a groove or slot 33 of a test jig base 34. A test board 35 is also fastened to the base 34 in a conventional manner such as by a hinge 36. A number of the probe pins 10 are inserted through the board 35 so that when the board is aligned with the printed circuit board 23 as shown in FIG. 4, the probe pins 10 are in a slight pressure engagement of one to two ounces force with selected solder pads at the contact face 21 of each of the probe pins. A typical test apparatus has test circuitry referred to at 37 with external leads such as 38 connected to frictional terminal connectors 39 which are fastened to the closed end 14 of the tube 13. Thus, during testing a circuit is completed from the terminal 39 to the metallic tube 13, the rod 12, the contact head 15, and the contact face 16 to a solder pad such as 27 to test the electronic component 30, for example.

As shown in FIG. 5, the solder pad 27 is almost conical in configuration. The desirable 1 to 2 ounce pressure of the probe pin 10 against the solder pad 27, causes the pile surface 21 of the conductive fabric 16 to deform readily and engage the surface of the solder pad over a sufficient area to insure a low resistance area type contact. In FIG. 6, the solder pad 28 does not quite cover the terminal wire which leaves a slight projection 41 extending above the surface of the solder pad. With the slight pressure exerted between the pin 10 and the board 23, the contact face 21 of the pin 10 deforms to provide an area contact wherein a multitude of the fibers engage not only the irregular curved surface of the solder pad but also the peripheral surface of the wire connector 41. Even if the wire connector 41 extended a distance slightly greater than the thickness of the cloth 16, the fibers would tend to deform to contact the peripheral surface of the portion 41. In FIG. 7, the solder pad 29 is shown to have a multitude of surface irregularities consisting of spaced depressions and projections. The slight axial pressure of the pin 10 causes the pile of the fabric 16 to deform and conform such that the fibers engage the irregular surface sufficiently to provide the required area low resistance electrical contact. In actual practice, a probe pin construction in accordance with the present invention provided an interface resistance with solder pads of various configurations no greater than ½ on ohm with a current of 100 milliamps. Thus, when used with digital printed circuit boards where the minimum circuit impedance is approximately 200 ohms, the contact resistance between the contact face 21 and the solder pad 27 is negligible.

In one actual reduction to practice, a conventional spring loaded probe pin was modified by the addition of a disc shaped pad of conductive nylon cloth cemented to the contact head portion of the shank by electrically conductive epoxy resin, highly filled with metallic powder, such as silver, or copper, etc. Although the pile portion of the conductive nylon cloth is in the form of a loop, it is contemplated that the probe pin could include a cloth having a sheared pile, for example.

Referring to FIG. 8, the pin 10 has a contact face 42 cut or stamped from a sheet of electrically conductive resin according to an alternate embodiment, in pressure engagement with the solder pad 29. In this embodiment, the piece 42 is of sufficient thickness and resiliency such that its face conforms substantially to the irregular surface 21 to provide the low resistance area contact.

Thus, there is provided an improved probe pin for the testing of printed circuit boards having a contact face of electrically conductive resilient resin that provides a low resistance area contact with solder pads of various configurations and irregularities, including the residual conformal coating on portions of such solder pads. Further, the contact faces need not be individually made in miniature size for the various size probe pins, but may be easily cut from a large piece of an electrically conductive sheet or cloth of the type described which renders the manufacture of such probe pins economical.

While the probe pin of the present invention has been described in connection with its use in the testing of printed circuit boards, it is understood that it may be used with an apparatus where a low resistance area contact is desired for irregular surfaces. Also, it is apparent that various modifications may be made in the structure and configuration of the illustrated embodiment.

What we claim is:

1. A probe pin for contacting electrically at one end a metallic mass having an irregular surface, comprising an elongated metallic shank, a single piece of electrically conductive resilient deformable synthetic resin affixed conductively to one end of the shank, whereby the piece provides a low resistance area contact with the irregular surface when the shank is urged axially in slight pressure engagement with the irregular surface.

2. A probe pin according to claim 1 wherein the resin piece is in the form of a conductive fabric having a deformable pile fiber surface.

3. A probe pin according to claim 2 wherein the pile fibers are each a fraction of a mil in thickness.

4. A probe pin according to claim 2 where the pile of the conductive fabric is a looped pile of conductive resin.

5. A probe pin according to claim 2 wherein the conductive fabric is affixed to the one end of the shank with conductive epoxy cement.

6. A probe pin according to claim 2 wherein the pile of the conductive fabric is made up of conductive fibers of approximately ½ mil in thickness.

7. A probe pin for contacting electrically an irregular metallic conductive surface, comprising a spring loaded telescopic shank, and a single piece of electrically conductive resilient deformable synthetic resin affixedly positioned conductively to one end of the shank, said piece being deformable in response to pressure engagement of the piece against an irregularly contoured surface sufficient to compress the spring loaded shank, whereby an electrically conductive low resistance area contact is made between the probe pin and the irregular metallic surface.

8. A probe pin according to claim 7 wherein the resilient piece is a fabric having a short fiber pile with fibers approximately ½ mil in diameter, and being of sufficient length whereby a slight force in a substantially axial direction against the pile fibers of the fabric at least sufficient to compress axially the telescopic shank, deforms the pile to physically engage the area of an irregular metallic surface.

* * * * *